United States Patent
Kim

(10) Patent No.: US 9,784,891 B2
(45) Date of Patent: Oct. 10, 2017

(54) DISPLAY DEVICE

(71) Applicant: Samsung Display Co., LTD., Yongin-si, Gyeonggi-do (KR)

(72) Inventor: Donggyu Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/018,626

(22) Filed: Feb. 8, 2016

(65) Prior Publication Data
US 2016/0231467 A1    Aug. 11, 2016

(30) Foreign Application Priority Data
Feb. 11, 2015 (KR) .................. 10-2015-0020861

(51) Int. Cl.
| G02B 27/10 | (2006.01) |
| G02F 1/1335 | (2006.01) |
| G02B 3/00 | (2006.01) |
| G02B 1/04 | (2006.01) |
| G02B 27/22 | (2006.01) |

(52) U.S. Cl.
CPC ............ G02B 3/005 (2013.01); G02B 1/04 (2013.01); G02B 27/2214 (2013.01)

(58) Field of Classification Search
CPC .................. G02B 27/09; G02F 2001/133607
USPC ................... 359/618, 619; 349/62, 64
See application file for complete search history.

(56) References Cited

U.S. PATENT DOCUMENTS

| 2006/0290852 A1 | 12/2006 | Yum |
| 2009/0174837 A1* | 7/2009 | Chang ............... G02F 1/133606 349/62 |
| 2009/0316083 A1* | 12/2009 | Kishioka ........... G02F 1/133526 349/95 |
| 2011/0255170 A1 | 10/2011 | Yamada et al. |
| 2012/0050344 A1 | 3/2012 | Kim et al. |
| 2016/0091786 A1* | 3/2016 | Kazmierski .......... H04N 9/3138 353/20 |

FOREIGN PATENT DOCUMENTS

| JP | 2013-084477 A | 5/2013 |
| KR | 10-2006-0134538 A | 12/2006 |
| KR | 10-2009-0106062 A | 10/2009 |
| KR | 10-2011-0062074 A | 6/2011 |
| KR | 10-2011-0107815 A | 10/2011 |
| KR | 10-2012-0019016 A | 6/2012 |

* cited by examiner

*Primary Examiner* — William Choi
(74) *Attorney, Agent, or Firm* — Lewis Roca Rothgerber Christie LLP

(57) ABSTRACT

A display device includes: a display panel including a display area and a transmission area; and an optical member on the display panel, and the optical member includes at least a light collecting portion, and a center of the light collecting portion and a center of the transmission area are on a substantially same axis.

17 Claims, 8 Drawing Sheets

DISPLAY DEVICE

CROSS-REFERENCE TO RELATED APPLICATION

This application claims priority to and the benefit of Korean Patent Application No. 10-2015-0020861, filed on Feb. 11, 2015, with the Korean Intellectual Property Office, the disclosure of which is incorporated herein in its entirety by reference.

BACKGROUND

1. Field

Embodiments of the present invention relate to a display device, and more particularly, to a transparent display device.

2. Description of Related Art

Display devices are classified into liquid crystal display (LCD) devices, organic light emitting diode (OLED) display devices, plasma display panel (PDP) devices, electrophoretic display (EPD) devices, and the like, based on a light emitting scheme thereof.

With recent development in electronics technology, various types of display devices are being widely used. Among these, in particular, a transparent display device displays a character or an image while maintaining visual transparency thereof.

Examples of display elements applicable to such a transparent display device may include an OLED element, an LCD element, an EPD element, and the like. Among these, an OLED element is gaining attention as a suitable display element for a transparent display device due to various advantages thereof in terms of a viewing angle, a contrast, response speed, power consumption, and the like.

Such a transparent display device using an OLED element includes a display area and a transmission area. The display area includes a thin film transistor, various signal connecting wirings, an electrode wiring, an organic light emitting material, and the like, disposed therein; and the transmission area includes a transparent substrate, a transparent insulating layer, and the like, disposed therein.

In a switched-off state of a transparent display device, an object or an image behind the display device (e.g., positioned opposite to a user) is transmitted through the transparent display device to be visible to the user. However, even in the case of the transparent display device, due to a low level of transmittance of a thin film transistor and various wirings of a display area and a limited space occupied by a transmission area, an overall level of transmittance of the transparent display device is relatively low.

It is to be understood that this background of the technology section is intended to provide useful background for understanding the technology, and as such, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present invention are directed to a display device capable of increasing a level of transmittance thereof.

According to an exemplary embodiment of the present invention, a display device includes: a display panel including a display area and a transmission area; and an optical member on the display panel, and the optical member includes at least a light collecting portion, and a center of the light collecting portion and a center of the transmission area are on a substantially same axis.

The optical member may further include a depression portion, and a center of the depression portion and the center of the transmission area may be on a substantially same axis.

The light collecting portion may have a convex lens shape.

The depression portion may have a concave lens shape.

The light collecting portion and the depression portion may have a substantially same curvature.

The light collecting portion and the depression portion may have different curvatures.

The light collecting portion may have a curvature smaller than a curvature of the depression portion.

The center of the depression portion and the center of the light collecting portion may be on a substantially same axis.

The light collecting portion may have a width greater than a width of the transmission area.

The depression portion may have a width substantially the same as a width of the transmission area.

The optical member may have a thickness of greater than or equal to about 1 millimeter (mm) and less than or equal to about 5 mm.

The optical member may include at least one material selected from the group consisting of polycarbonate (PC), poly(methyl methacrylate) (PMMA), an acrylonitrile-butadiene-styrene (ABS) copolymer, and an acrylic resin.

The light collecting portion may have a strip shape elongatedly extending in a direction.

The light collecting portion may have a dot shape.

The display device may further include an adhesive member between the display panel and the optical member.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Figure 1:
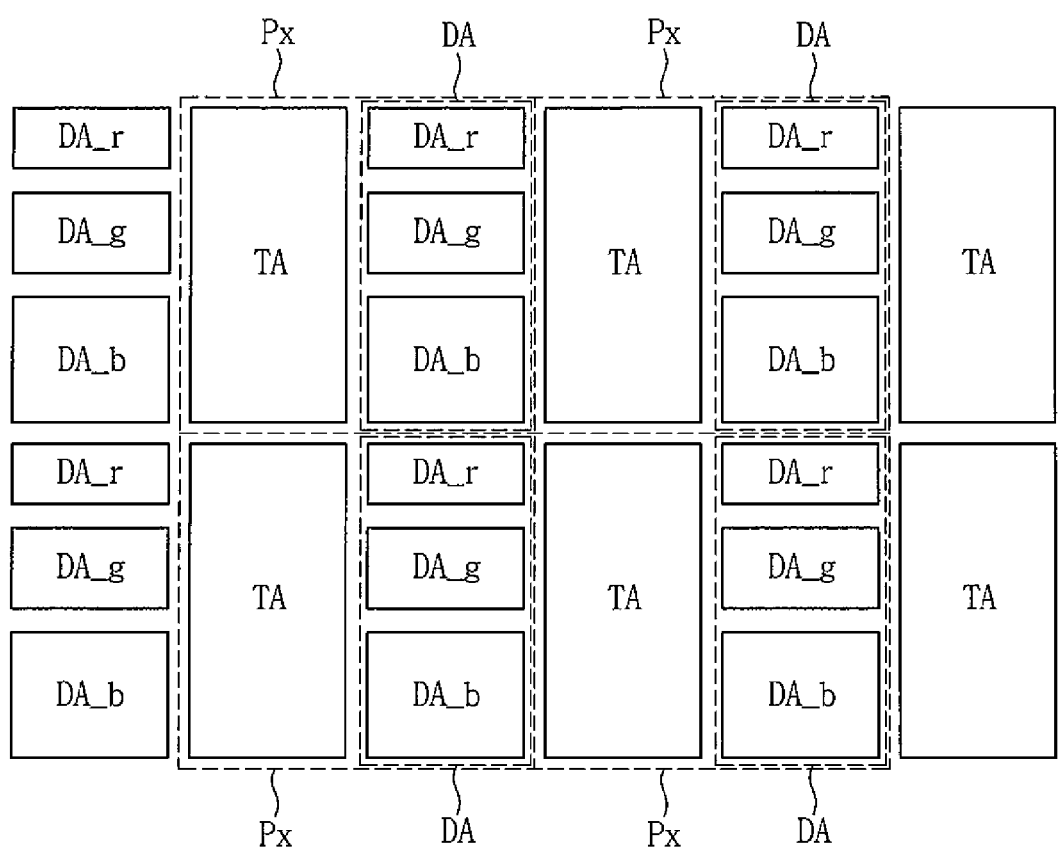
FIG. 1 is a plan view schematically illustrating a conventional display device.

Hereinafter, embodiments of the present invention will now be described in more detail with reference to the accompanying drawings.

The invention may, however, be embodied in many different forms and should not be construed as being limited to the embodiments set forth herein. Rather, these embodiments are provided so that this disclosure will be more thorough and complete, and will more fully convey the scope of the invention to those skilled in the art. Accordingly, processes, elements, and techniques that are not necessary to those having ordinary skill in the art for a complete understanding of the aspects and features of the present invention may not be described.

Throughout the specification, when an element is referred to as being "connected" to another element, the element may be "directly connected" to the other element, or "electrically connected" to the other element with one or more intervening elements interposed therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Expressions such as "at least one of," when preceding a list of elements, modify the entire list of elements and do not modify the individual elements of the list. Further, the use of "may" when describing embodiments of the present invention refers to "one or more embodiments of the present invention."

It will be understood that, although the terms "first", "second", and the like, may be used herein to describe various elements, components, areas, layers and/or sections, these elements, components, areas, layers and/or sections should not be limited by these terms. These terms are only used to distinguish one element, component, area, layer or section from another element, component, area, layer or section. Thus, a first element, component, area, layer or section discussed below could be termed a second element, component, area, layer or section without departing from the teachings of example embodiments.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In the drawings, certain elements or shapes may be simplified or exaggerated to better illustrate embodiments of the present invention, and other elements present in an actual product may also be omitted. Thus, the drawings are intended to facilitate the understanding of the present invention. Like reference numerals refer to like elements throughout the attached drawings and the specification, and thus, descriptions thereof will not be repeated.

Figure 2:
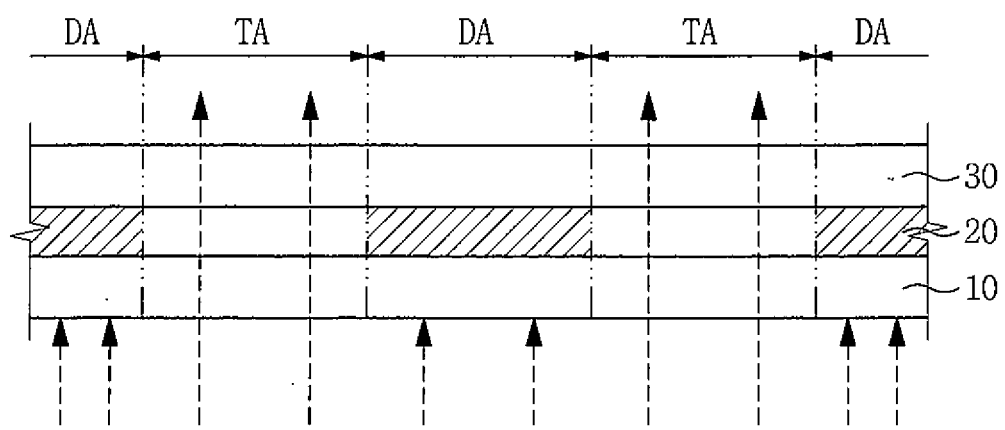
FIG. 2 is a cross-sectional view schematically illustrating a conventional display device.

FIG. 1 is a plan view schematically illustrating a conventional display device; and FIG. 2 is a cross-sectional view schematically illustrating a conventional display device.

FIG. 1 schematically illustrates an example of four adjacent pixels Px being arranged in a 2*2 matrix form, and each pixel Px may include a display area DA and a transmission area TA. The display area DA, for example, may include a red display area DA_r, a green display area DA_g, and a blue display area DA_b.

In a case in which the display device is in a switched-on state, an image may be displayed through the display area DA; and in a case in which the display device is in a switched-off state, an object or a background positioned behind the display device may be transmitted through the transmission area TA, such that a user may recognize the display device to be transparent.

Referring to FIG. 2, the conventional transparent display device may include a substrate 10, a display element 20 on the substrate 10, and an encapsulation substrate 30 on the display element 20. The substrate 10 and the encapsulation substrate 30 may be formed of a transparent material, and the display element 20 may include a display area DA in which a thin film transistor, various signal connecting wirings, an electrode wiring, an organic light emitting material, and the like, are disposed, and a transmission area TA in which a transparent insulating layer, and the like, are disposed.

A portion of FIG. 2 denoted by dotted lines indicates a path of light which is incident on the display device to be transmitted therethrough. Since the thin film transistor and the various wirings of the display area DA have a relatively low level of transmittance, a light vertically incident on the display area DA may not be transmitted therethrough and only a light vertically incident on the transmission area TA may be transmitted therethrough.

Further, since a space occupied by the transmission area TA in an overall display device is limited, a level of transmittance of the display device may be relatively low. Accordingly, according to an exemplary embodiment, a transparent display device capable of increasing a level of transmittance thereof may be provided.

Figure 3:
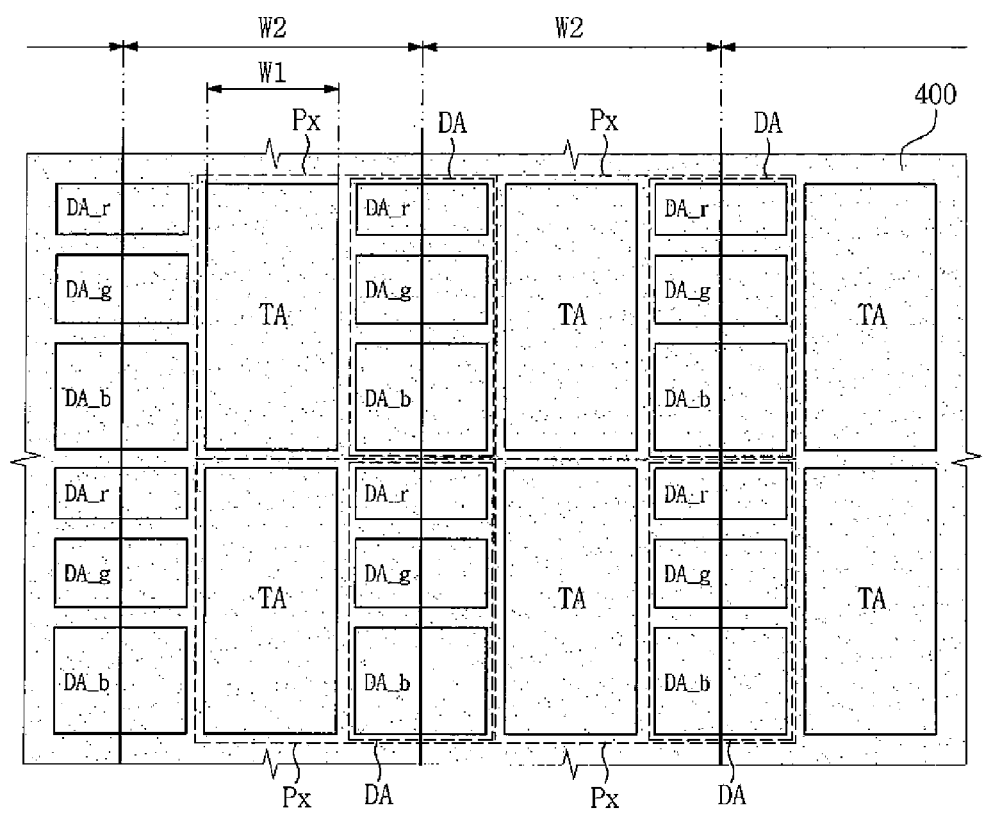
FIG. 3 is a plan view schematically illustrating a display device according to an exemplary embodiment of the present invention.
Figure 4:
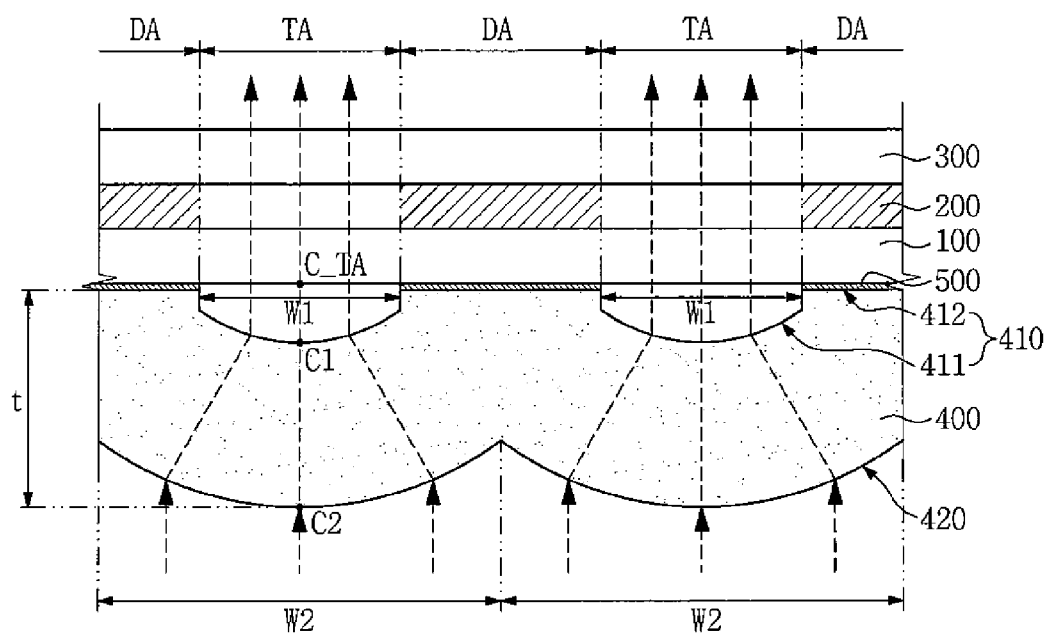
FIG. 4 is a cross-sectional view schematically illustrating a display device according to an exemplary embodiment of the present invention.
Figure 5:
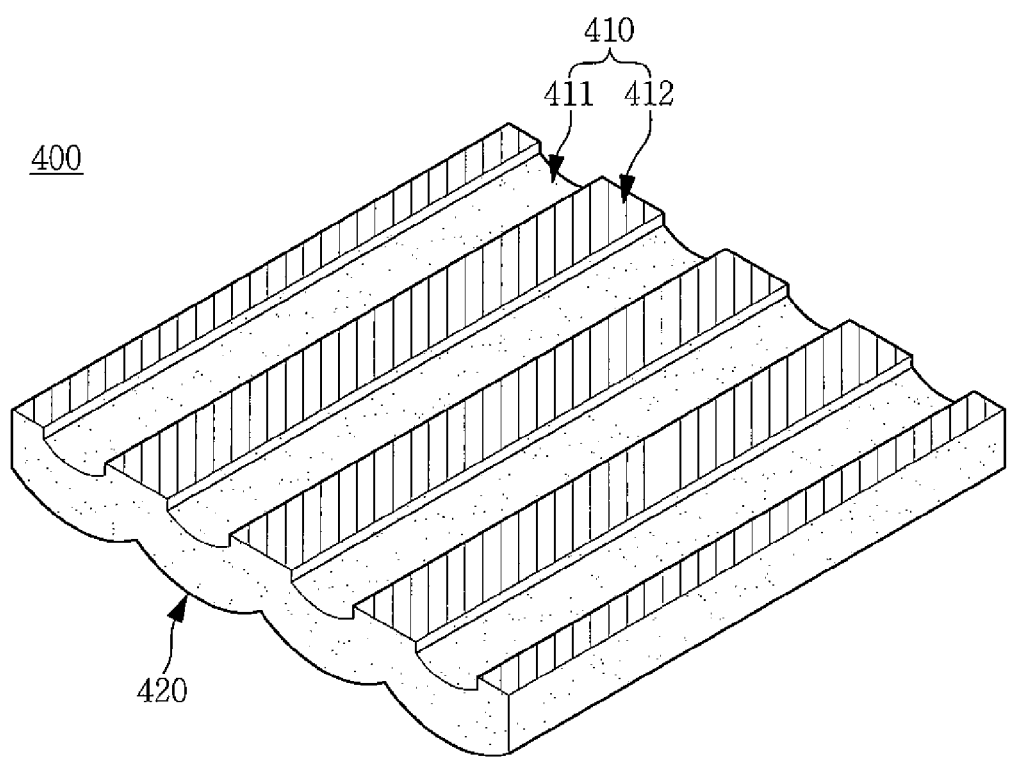
FIG. 5 is a perspective view illustrating a portion of an optical member according to an exemplary embodiment of the present invention.

FIG. 3 is a plan view schematically illustrating a display device according to an exemplary embodiment of the present invention; FIG. 4 is a cross-sectional view schematically illustrating a display device according to an exemplary embodiment of the present invention; and FIG. 5 is a perspective view illustrating a portion of an optical member according to an exemplary embodiment of the present invention.

FIG. 3 schematically illustrates an example of four adjacent pixels Px being arranged in a 2*2 matrix form, and each pixel Px may include a display area DA and a transmission area TA. The display area DA, for example, may include a red display area DA_r, a green display area DA_g, and a blue display area DA_b.

A display area DA may include a thin film transistor, various signal connecting wirings, an electrode wiring, an organic light emitting material, and the like, disposed therein, and a transmission area TA may include a transparent insulating layer, and the like, disposed therein. In addition, various signal connecting wirings may be disposed in an area between the transmission area TA and the display area DA.

Hereinafter, the display area DA and the area between the transmission area TA and the display area DA, aside from the transmission area TA, will be collectively referred to as a non-transmission area, for ease of description.

A transmission area TA within a single pixel Px, as illustrated in FIG. 3, may be formed to have a size substantially the same as a size of the entire display area DA, or may be formed to have a size the same as a size of each of the red, green, and blue display areas DA_r, DA_g, and DA_b.

In addition, the size and disposition sequence of the red, green, and blue display areas DA_r, DA_g, and DA_b are not limited to the example illustrated in FIG. 3, and the red, green, and blue display areas DA_r, DA_g, and DA_b may have various sizes or may be disposed in various manners.

A display device according to an exemplary embodiment may include a substrate 100, a display panel including a display element 200 on the substrate 100 and an encapsulation substrate 300 on the display element 200, and an optical member 400 disposed on the display panel.

Although FIG. 3 illustrates the optical member 400 as being disposed on an entire surface of the display panel in order to describe a position at which the optical member 400 is to be disposed, the disposition of the optical member 400 is not necessarily limited thereto. In a case in which the display panel is a top-emission-type display panel, the optical member 400 may be disposed on a lower surface of the substrate 100; and in a case in which the display panel is a bottom-emission-type display panel, the optical member 400 may be disposed on an upper surface of the encapsulation substrate 300.

The substrate 100 and the encapsulation substrate 300 may be formed of a transparent material, and the display element 200 may include a display area DA in which a thin film transistor, various signal connection wirings, an electrode wiring, an organic light emitting material, and the like, are disposed and a transmission area TA in which a transparent insulating layer, and the like, are disposed. A detailed description of the display element 200 will be provided further.

The optical member 400 may be formed of a transparent material having a thickness (e.g., a predetermined thickness) "t". The optical member 400 may have a thickness of greater than or equal to about 1 millimeter (mm) and less than or equal to about 5 mm, and may include at least one selected from polycarbonate (PC), poly(methyl methacrylate) (PMMA), an acrylonitrile-butadiene-styrene (ABS) copolymer, and an acrylic resin.

The optical member 400 may have at least a depression portion 411 on a surface 410 of the optical member 400 facing the display panel, and may have a supporting surface 412 on which the depression portion 411 is absent. In addition, the optical member 400 may have at least a light collecting portion 420 on a surface of the optical member 400 opposite to the surface 410 of the optical member 400.

The depression portion 411 may have a concave lens shape having at least a curvature, and the light collecting portion 420 may have a convex lens shape having at least a curvature.

In particular, the depression portion 411 and the light collecting portion 420 may be formed to have substantially the same curvature; however, the curvature of the depression portion 411 and the light collecting portion 420 is not limited thereto, and the depression portion 411 and the light collecting portion 420 may have different curvatures. According to an exemplary embodiment, the light collecting portion 420 may have a curvature smaller than that of the depression portion 411.

The depression portion 411 and the light collecting portion 420 may be disposed to correspond to the transmission area TA of the display panel. That is, a center C_TA of the transmission area TA may be disposed on an axis substantially the same as that of a center C1 of the depression portion 411 and a center C2 of the light collecting portion 420. The aforementioned axis may be a virtual axis perpendicular to a plane of the transmission portion TA at a center thereof.

Referring to FIGS. 3 and 5, the depression portion 411 and the light collecting portion 420 may have a strip shape elongatedly extending in a direction along the transmission area TA of the display panel.

The depression portion 411 may have a width W1 substantially the same as that of the transmission area TA. The light collecting portion 420 may have a width W2 greater than that of the transmission area TA. In a display device according to an exemplary embodiment, the width W2 of the light collecting portion 420 may be twice the width W1 of the depression portion 411.

A portion of FIG. 4 denoted by dotted lines indicates a path of light which is incident on the display device to be transmitted therethrough. Referring to FIG. 4, a display device according to an exemplary embodiment may enhance a level of transmittance of the display device by extracting, to the transmission area TA, a light vertically incident on the display area DA which would otherwise fail to be transmitted therethrough, using the optical member 400 having the depression portion 411 and the light collecting portion 420.

That is, the light vertically incident on the display area DA may be collected at the transmission area TA of the display panel by the light collecting portion 420 of the optical member 400, and the collected light may be converted into a vertical light by the depression portion 411 of the optical member 400 to be transmitted (or extracted) through the transmission area TA of the display panel.

An adhesive member 500 may further be interposed between the substrate 100 and the supporting surface 412 of the optical member 400. The adhesive member 500 may include (or use) any type of commonly used adhesive member without particularly being limited. For example, the adhesive member 500 may be an optical clear adhesive (OCA) or an optical clear resin (OCR). A display device according to an exemplary embodiment may include the optical member 400 having a thickness (e.g., a predetermined thickness) and disposed on the display panel, thereby enhancing mechanical strength of the display panel. The optical member 400 may be integrally formed through an injection molding process.

Figure 6:
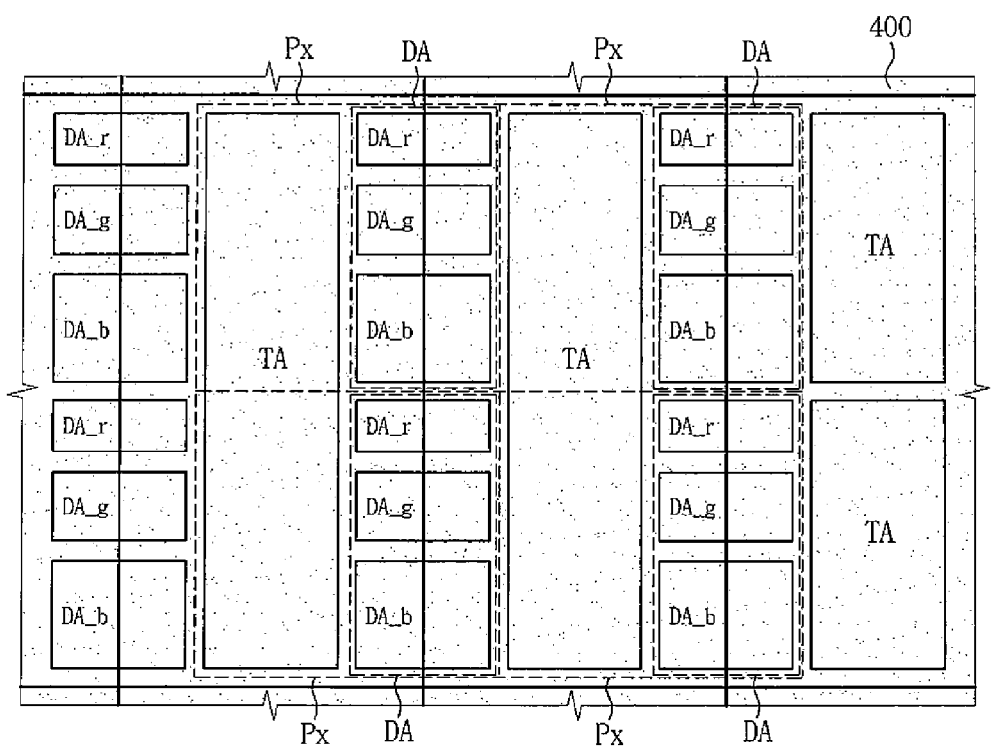
FIGS. 6 and 7 are plan views schematically illustrating display devices according to other exemplary embodiments of the present invention, respectively.
Figure 7:
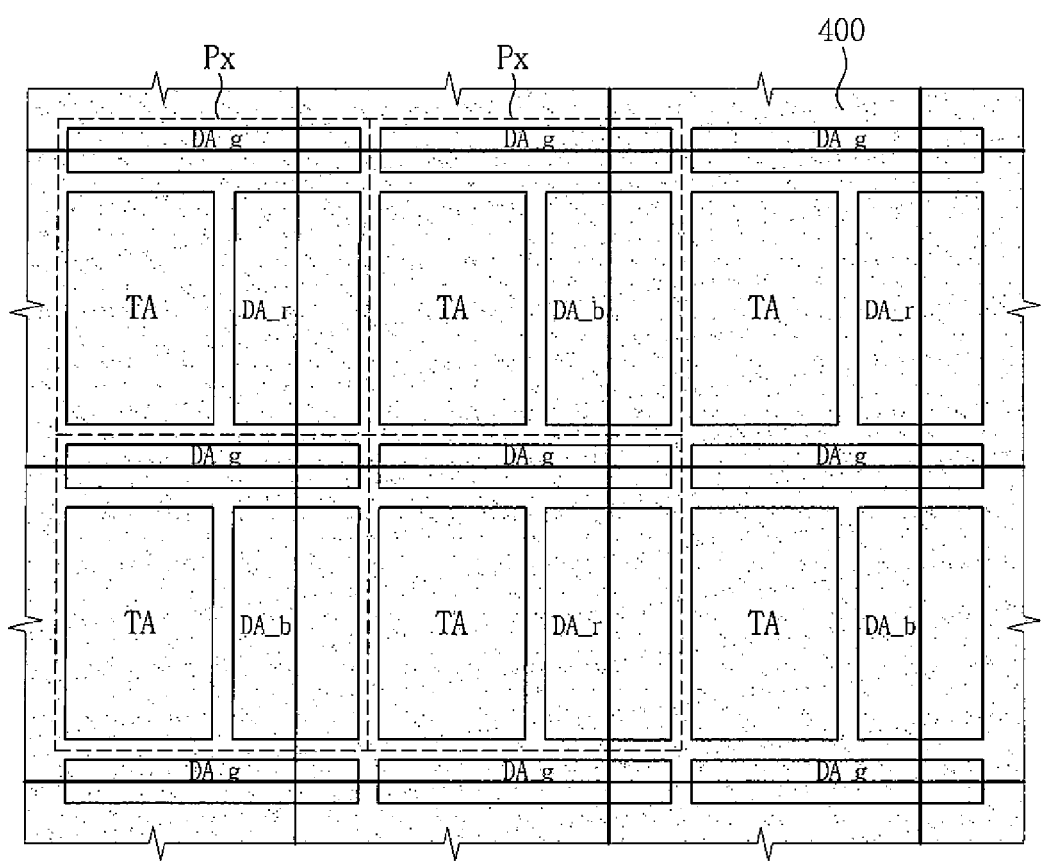

FIGS. 6 and 7 are plan views schematically illustrating display devices according to other exemplary embodiments of the present invention, respectively.

Although FIGS. 6 and 7 illustrate an optical member 400 as being disposed on an entire surface of a display panel in order to describe a position at which the optical member 400 is to be disposed, the disposition of the optical member 400 is not limited thereto. In a case in which the display panel is a top-emission-type display panel, the optical member 400 may be disposed on a lower surface of a substrate; and in a case in which the display panel is a bottom-emission-type display panel, the optical member 400 may be disposed on an upper surface of an encapsulation substrate.

FIG. 6 illustrates a structure in which transmission areas of two adjacent pixels are integrated. In a case of having such an integrated transmission area, a diffraction pattern due to a non-transmission area between the transmission areas may be significantly reduced. In this case, a depression portion and a light collecting portion of the optical member 400 may have a dot shape to thereby correspond to the transmission areas TA of the display panel which are adjacently disposed in a vertical manner. Due to such a dot shape of the optical member 400, a back light from an increased area of the transmission area TA may be transmitted therethrough.

FIG. 7 illustrates a pixel structure including a green display area DA_g having a sensitive visibility, a transmission area TA, and one selected from a red display area DA_r and a blue display area DA_b. In this instance, one selected from the red display area DA_r and the blue display area DA_b may be disposed for each pixel to form a zigzag arrangement thereof. In this case, a depression portion and a light collecting portion of the optical member 400 may have a dot shape to thereby correspond to a transmission area TA for each pixel. With such a dot shape of the optical member 400, a back light from a non-transmission area may be transmitted therethrough.

Figure 8:
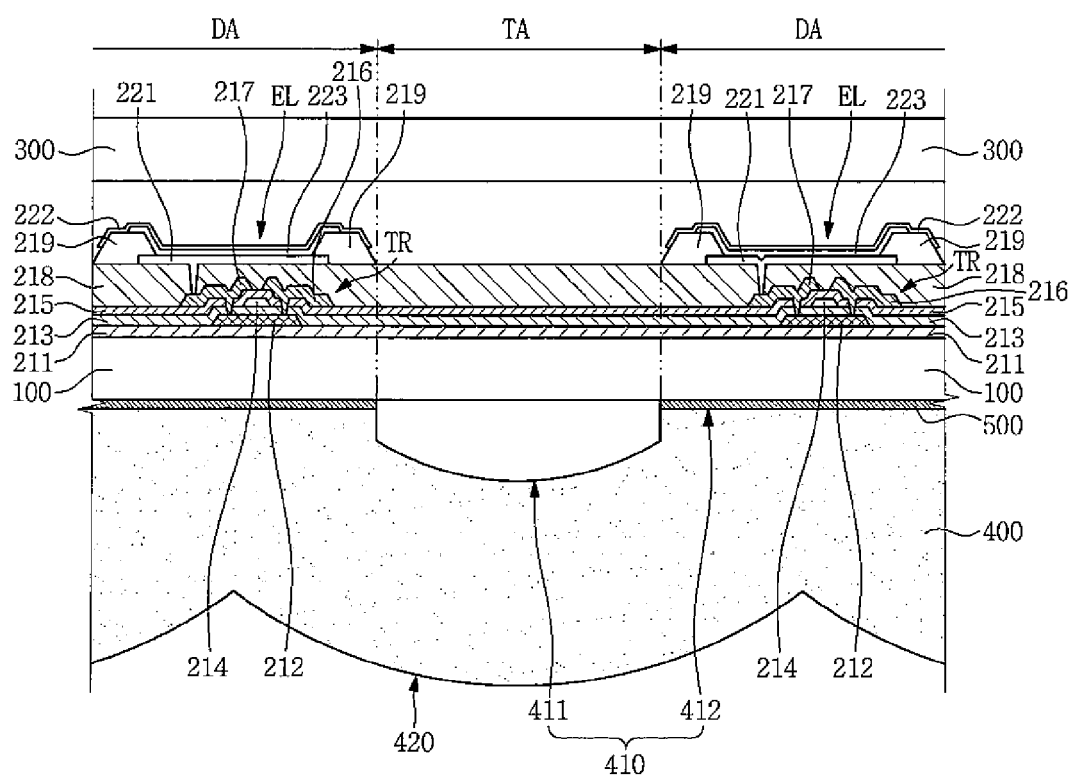
FIG. 8 is a cross-sectional view illustrating a display device according to an exemplary embodiment of the present invention.

FIG. 8 is a cross-sectional view illustrating a display device according to an exemplary embodiment of the present invention.

Referring to FIG. 8, a display device according to an exemplary embodiment may include the substrate 100, the display panel including the display element 200 on the substrate 100 and the encapsulation substrate 300 on the display element 200, and the optical member 400 disposed on the display panel.

The display element 200 may include a display area DA in which a thin film transistor TR, various signal connecting wirings, an electrode wiring, an organic light emitting material, and the like, are disposed, and a transmission area TA in which a transparent insulating layer, and the like, are disposed.

The substrate 100 may include (or use) a transparent insulating substrate including glass, tempered glass, plastic formed of a transparent material, or the like. For example, such plastic formed of a transparent material may include at least one selected from the group consisting of Kapton, polyethersulphone (PES), polycarbonate (PC), polyimide (PI), polyethyleneterephthalate (PET), polyethylenenaphthalate (PEN), polyarylate (PAR), polyacrylate, and fiber reinforced plastic (FRP).

A buffer layer 211 may be disposed on the substrate 100. The buffer layer 211 may serve to prevent the infiltration of impure elements through the substrate 100 and planarize a surface of the substrate 100. The buffer layer 211 may be formed of various types of materials capable of performing the aforementioned functions. For example, the buffer layer 211 may include one selected from the group consisting of silicon nitride ($SiN_x$), silicon oxide ($SiO_2$), and silicon oxynitride ($SiO_xN_y$). However, the buffer layer 211 is not necessarily required, and thus may be omitted based on the type, the process conditions, and the like, of the substrate 100.

A semiconductor layer 212 may be disposed on the buffer layer 211. The semiconductor layer 212 may be formed using one of a polycrystalline silicon layer, an amorphous silicon layer, and an oxide semiconductor such as indium-gallium-zinc oxide (IGZO) and indium-zinc-tin oxide (IZTO).

A gate insulating layer 213 may be disposed on the semiconductor layer 212. The gate insulating layer 213 may include at least one of tetraethyl orthosilicate (TEOS), $SiN_x$, and $SiO_2$. For example, the gate insulating layer 213 may have a double layer structure in which a $SiN_x$ layer having a thickness of about 40 nanometers (nm) and a TEOS layer having a thickness of about 80 nm are sequentially stacked.

A gate electrode 214 may be disposed on the gate insulating layer 213. The gate insulating layer 213 may be disposed to overlap at least a portion of the semiconductor layer 212.

An insulating interlayer 215 may be disposed on the gate insulating layer 213 to cover the gate electrode 214 thereon. The insulating interlayer 215 may be formed of one of $SiN_x$, $SiO_x$, TEOS, and the like, in a manner similar to that of the gate insulating layer 213; however, the type of material forming the insulating interlayer 215 is not limited thereto.

A source electrode 216 and a drain electrode 217 may be disposed on the insulating interlayer 215. The source electrode 216 and the drain electrode 217 may be connected to the semiconductor layer 212 through respective contact holes, each of the contact holes being formed in the gate insulating layer 213 and the insulating interlayer 215.

The configuration of the thin film transistor TR is not limited to the aforementioned description, and may be modified in various manners to include configurations known in the art and easily applicable by those skilled in the art.

A planarization layer 218 may be disposed on the insulating interlayer 215 to cover the source electrode 216 and the drain electrode 217 thereon. The planarization layer 218 may serve to remove a difference in the heights of the elements disposed on the insulating interlayer 215 and may planarize the elements disposed on the insulating interlayer 215 in order to enhance the light emission efficiency of an OLED element EL to be formed on the planarization layer 218.

The planarization layer 218 may be formed of at least one of the following materials: a polyacrylate resin, an epoxy resin, a phenolic resin, a polyamide resin, a polyimide resin, an unsaturated polyester resin, a polyphenylether resin, a polyphenylenesulfide resin, and benzocyclobutene (BCB).

A first electrode 221 of the OLED element EL may be disposed on the planarization layer 218. The first electrode 221 may be connected to the drain electrode 217 through a contact hole formed in the planarization layer 218.

A pixel defining layer 219 defining a pixel area by exposing at least a portion of the first electrode 221 may be disposed on the planarization layer 218. The pixel defining layer 219 may be formed of a resin such as a polyacrylate resin or a polyimide resin.

An organic light emitting layer 223 may be disposed on the first electrode 221 within the pixel area, and a second electrode 222 may be disposed on the pixel defining layer 219 and the organic light emitting layer 223. The organic light emitting layer 223 may be formed of a low molecular weight organic material or a polymer organic material. At least one of a hole injection layer HIL and a hole transporting layer HTL may further be interposed between the first electrode 221 and the organic light emitting layer 223, and at least one of an electron transporting layer ETL and an electron injection layer EIL may further be interposed between the organic light emitting layer 223 and the second electrode 222.

Each of the first electrode 221 and the second electrode 222 may be formed using one of a transmissive electrode, a transflective electrode, or a reflective electrode.

The transmissive electrode may be formed of transparent conductive oxide (TCO). TCO may include at least one selected from the group consisting of indium-tin oxide (ITO), indium-zinc oxide (IZO), antimony-tin oxide (ATO), aluminum-zinc oxide (AZO), zinc oxide (ZnO), and a compound thereof.

The transflective and reflective electrodes may be formed of a metal such as magnesium (Mg), silver (Ag), gold (Au), calcium (Ca), lithium (Li), chromium (Cr), aluminum (Al), or copper (Cu), or an alloy thereof. Here, the type of electrode, that is, whether the transflective electrode or the reflective electrode, may be determined based on a thickness thereof. In one embodiment, the transflective electrode may have a thickness of about 200 nm or less, and the reflective electrode may have a thickness of about 300 nm or more. As the thickness of the transflective electrode decreases, the light transmittance thereof may increase while the resistance thereof may increase. As the thickness of the transflective electrode increases, the light transmittance thereof may decrease.

In addition, the transflective and reflective electrodes may have a multilayer structure including a metal layer formed of a metal or a metal alloy and a TCO layer stacked on the metal layer.

The encapsulation substrate 300 may be disposed above the second electrode 222 while being spaced apart therefrom. The encapsulation substrate 300 may include (or use) a transparent insulating substrate including glass, plastic formed of a transparent material, or the like. In addition, the encapsulation layer 300 may have a thin film encapsulation structure in which at least an inorganic layer and at least an organic layer are alternately stacked.

The optical member 400 may be disposed on the lower surface of the substrate 100, and may extract, to the transmission area TA, a light vertically incident on the display area DA which would otherwise fail to be transmitted therethrough.

In other words, the light vertically incident on the display area DA may be collected at the transmission area TA by the light collecting portion 420 of the optical member 400, and the collected light may be converted into a vertical light by the depression portion 411 of the optical member 400 to be transmitted (or extracted) through the transmission area TA of the display panel, and thus a level of transmittance of the display device may be enhanced.

In addition, due to the optical member 400 having a thickness (e.g., a predetermined thickness) being disposed on the display panel, mechanical strength of the display panel may be enhanced.

As set forth above, according to at least an exemplary embodiment, the display device may enhance an overall level of transmittance of external light by allowing an external light incident on the display area of the display panel to be transmitted through the transmission area of the display panel, using the optical member disposed on the display panel.

In addition, the display device may integrally form the optical member that is to be disposed on the display panel, thus having advantages of being aesthetically pleasing, relatively low in production costs, and suitable for mass production.

Moreover, the display device may include the optical member having a thickness (e.g., a predetermined thickness) disposed on the display panel, thereby enhancing mechanical strength of the display panel.

From the foregoing, it will be appreciated that various embodiments in accordance with the present disclosure have been described herein for purposes of illustration, and it is understood by those of ordinary skill in the art that various modifications may be made without departing from the scope and spirit of the present invention as defined by the following claims and their equivalents. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A display device comprising:
   a display panel comprising a display area and a transmission area; and
   an optical member on the display panel,
   wherein the optical member comprises a light collecting portion and a depression portion,
   wherein the light collecting portion has a convex lens shape, and the depression portion has a concave lens shape, and
   wherein a center of the light collecting portion and a center of the transmission area are on a substantially same axis.

2. The display device of claim 1, wherein the light collecting portion has a width greater than a width of the transmission area.

3. The display device of claim 1, wherein the optical member has a thickness of greater than or equal to about 1 millimeter (mm) and less than or equal to about 5 mm.

4. The display device of claim 1, wherein the optical member comprises at least one material selected from the group consisting of polycarbonate (PC), poly(methyl methacrylate) (PMMA), an acrylonitrile-butadiene-styrene (ABS) copolymer, and an acrylic resin.

5. The display device of claim 1, wherein the light collecting portion has a strip shape elongatedly extending in a direction.

6. The display device of claim 1, wherein the light collecting portion has a dot shape.

7. The display device of claim 1, further comprising an adhesive member between the display panel and the optical member.

8. A display device comprising:
a display panel comprising a display area and a transmission area; and
an optical member on the display panel, the optical member comprising a light collecting portion and a depression portion,
wherein a center of the depression portion, a center of the light collecting portion, and a center of the transmission area are on a substantially same axis.

9. The display device of claim 8, wherein the depression portion has a concave lens shape.

10. The display device of claim 8, wherein the light collecting portion and the depression portion have a substantially same curvature.

11. The display device of claim 8, wherein the light collecting portion and the depression portion have different curvatures.

12. The display device of claim 8, wherein the light collecting portion has a curvature smaller than a curvature of the depression portion.

13. The display device of claim 8, wherein the depression portion has a width substantially the same as a width of the transmission area.

14. A display device comprising:
a display panel comprising a display area and a transmission area; and
an optical member on the display panel, the optical member comprising a depression portion depressed from a surface facing the display panel, and a center of the depression portion and a center of the transmission area being on a substantially same axis.

15. The display device of claim 14, wherein the depression portion has a concave lens shape.

16. The display device of claim 14, wherein the optical member further comprises a light collecting portion, and
wherein a center of the light collecting portion, the center of the depression portion, and the center of the transmission area are on the substantially same axis.

17. The display device of claim 16, wherein the light collecting portion has a convex lens shape.

* * * * *